(12) United States Patent
Van Haren et al.

(10) Patent No.: US 8,017,310 B2
(45) Date of Patent: Sep. 13, 2011

(54) LITHOGRAPHIC METHOD

(75) Inventors: Richard Franciscus Johannes Van Haren, Waalre (NL); Ewoud Vreugdenhil, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 701 days.

(21) Appl. No.: 11/701,517

(22) Filed: Feb. 2, 2007

(65) Prior Publication Data

US 2008/0187845 A1 Aug. 7, 2008

(51) Int. Cl.
*G03F 7/26* (2006.01)
(52) U.S. Cl. .......................... 430/324; 430/323; 430/322
(58) Field of Classification Search .................. 430/322, 430/311, 324, 323, 313
See application file for complete search history.

(56) References Cited

U.S. PATENT DOCUMENTS

| | | | | |
|---|---|---|---|---|
| 4,400,867 A | * | 8/1983 | Fraser | 438/303 |
| 4,803,181 A | | 2/1989 | Buchmann et al. | |
| 6,057,080 A | * | 5/2000 | Brunsvold et al. | 430/273.1 |
| 6,335,546 B1 | * | 1/2002 | Tsuda et al. | 257/94 |
| 6,376,157 B1 | * | 4/2002 | Tanaka et al. | 430/314 |
| 6,383,952 B1 | * | 5/2002 | Subramanian et al. | 438/781 |

FOREIGN PATENT DOCUMENTS

| | | |
|---|---|---|
| JP | 62-232127 | 10/1987 |
| JP | 07-130631 | 5/1995 |
| JP | 2000-298356 | 10/2000 |
| JP | 2005-181758 | 7/2005 |

OTHER PUBLICATIONS

Kim, et al. "Realization of sub-80nm Small Space Patterning in ArF Photolithography," Proceedings of SPIE, vol. 5376, 2004, pp. 1082-1090.
Japanese Office Action mailed Nov. 19, 2010 in corresponding Japanese Patent Application No. 2008-015219.

* cited by examiner

*Primary Examiner* — Kathleen Duda
*Assistant Examiner* — Caleen O Sullivan
(74) *Attorney, Agent, or Firm* — Pillsbury Winthrop Shaw Pittman LLP

(57) ABSTRACT

A method of providing a pattern on a substrate is disclosed. The method includes providing a layer of photoresist on the substrate, providing a layer of top coating over the layer of photoresist, lithographically exposing the photoresist layer and developing the photoresist to form a structure, covering the structure with a coating layer, inducing a chemical reaction between the photoresist and the coating layer, which reaction does not occur in the top coating, to form regions of modified coating layer, and removing unmodified coating layer to leave behind a patterned structure formed from the regions of modified coating layer.

22 Claims, 5 Drawing Sheets

LITHOGRAPHIC METHOD

FIELD

The present invention relates to a lithographic method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"—direction) while synchronously scanning the substrate parallel or anti-parallel to this direction.

There is a continuing desire to be able to generate patterns with finer resolution. In general, shorter wavelength radiation may be used in order to achieve a finer resolution pattern. However, wavelengths shorter than 193 nanometers (which is currently used in many lithographic apparatus) are problematic to use, for example because they are easily absorbed by optical components.

SUMMARY

There is, for example, a desire to use alternative techniques to achieved patterns with increased resolution.

According to an aspect of the invention, there is provided a method of providing a pattern on a substrate, the method comprising providing a layer of photoresist on the substrate, providing a layer of top coating over the layer of photoresist, lithographically exposing the photoresist layer and developing the photoresist to form a structure, covering the structure with a coating layer, inducing a chemical reaction between the photoresist and the coating layer, which reaction does not occur in the top coating, to form regions of modified coating layer, and removing unmodified coating layer to leave behind a patterned structure formed from the regions of modified coating layer.

According to a further aspect of the invention there is provided a method of providing a pattern on a substrate, the method comprising providing a layer of poly-silicon on the substrate, providing a layer of silicon-nitride over the layer of poly-silicon, lithographically exposing the silicon-nitride and poly-silicon, developing the exposed silicon-nitride and poly-silicon to form a structure, forming regions of modified poly-silicon using sidewall processing, and removing the silicon-nitride and unmodified poly-silicon to leave behind a patterned structure formed from the modified poly-silicon.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
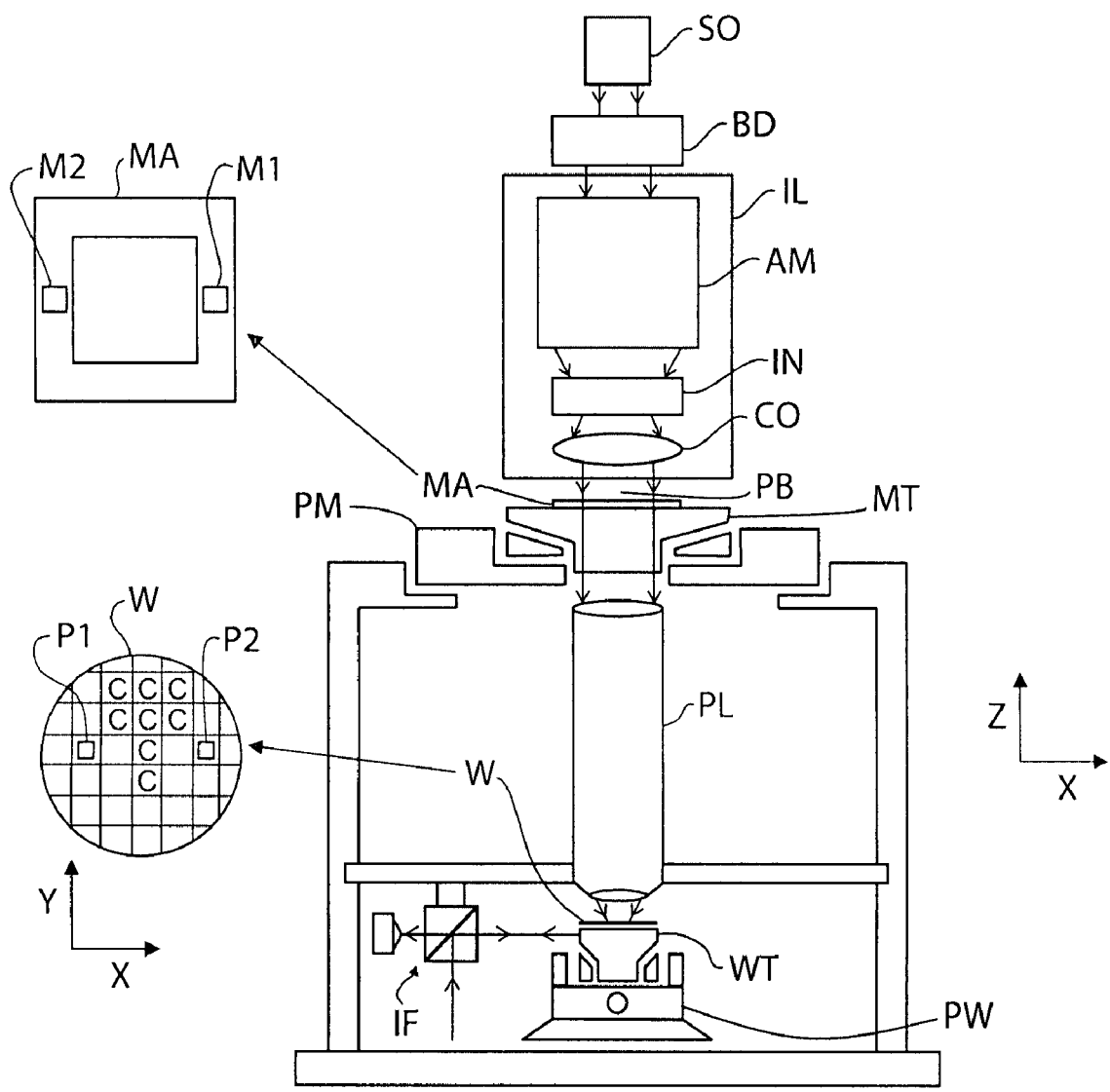
FIG. 1 depicts schematically a lithographic apparatus according to an embodiment of the invention.

FIG. 1 schematically depicts a lithographic apparatus according to an embodiment of the invention. The apparatus comprises:

an illumination system (illuminator) IL to condition a beam PB of radiation (e.g. UV radiation);

a support structure (e.g. a mask table) MT to support a patterning device (e.g. a mask) MA and connected to first positioning device PM to accurately position the patterning device with respect to item PL;

a substrate table (e.g. a wafer table) WT to hold a substrate (e.g. a photoresist-coated wafer) W and connected to second positioning device PW to accurately position the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The illumination system may also encompass various types of optical components, including refractive, reflective, and catadioptric optical components for directing, shaping, or controlling the beam of radiation, and such components may also be referred to below, collectively or singularly, as a "lens".

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structure are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 shows schematically an embodiment of the invention. FIG. 2a shows in cross-section a portion of a substrate 2. The substrate 2 is provided with a hardmask layer 4, a layer of photoresist 6 and a layer of top coating 8. The hardmask layer 4 may be formed from, for example, TiN, $SiO_2$, SiON or amorphous carbon (a-C). The photoresist 6 may be, for example, a positive tone photoresist. The photoresist may be selected to be sensitive to radiation at, for example, about 193 nm or 248 nm. The top coating 8 may be, for example, a conventional developable Top Anti-Reflection Coating (TARC). Other suitable materials may be used for the top coating. Requirements for the top coating material are that it is capable of acting as a chemical barrier between photoresist and a subsequently applied coating layer (described in relation to FIG. 2d below), and that it allows exposed regions to be selectively removed (described in relation to FIG. 2b below).

A lithographic apparatus, which may for example be of the type shown schematically in FIG. 1, is used to expose a pattern in the photoresist 6. The exposed photoresist is then removed, so that only unexposed photoresist remains. The exposed resist is removed using a developer such as a caustic solution containing $OH^-$. Following removal of the exposed resist, the substrate may be cleaned using de-ionized water. A chemical treatment may be performed which modifies a property of the unexposed photoresist. For example, a chemical component may be added to the resist such that the resist undergoes a chemical reaction when it comes into contact with the coating layer 14 (described in relation to FIG. 2c below).

Figure 2A:
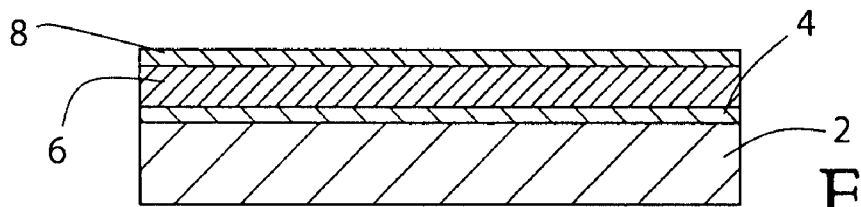
FIG. 2 shows schematically a lithographic method according to an embodiment of the invention.
Figure 2B:
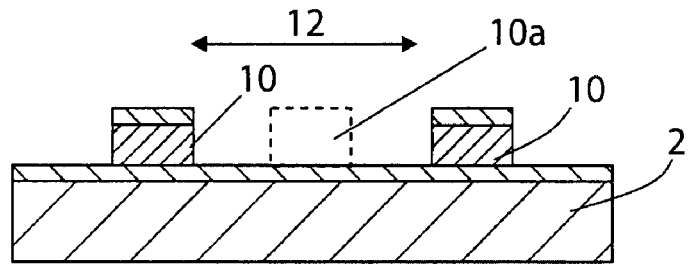

The resulting structure, shown in FIG. 2b, comprises two lines 10 which extend perpendicularly to the plane of FIG. 2. The space 12 between the two lines 10 is three times the width of the lines. This is advantageous because it allows the lines 10 to be narrower than would otherwise be possible. In general it is possible in lithography to print narrower features when there is more spacing between the features. For example, if the lithographic apparatus is operating at the limit of its resolution, it will be capable of exposing a pattern which provides the lines 10 with a wide separation 12, but would not be capable of providing the lines 10 with a further line located in the space 12 between them. An example of the line which cannot be imaged is shown by dotted line 10a.

To give an example of typical dimensions, in a lithographic apparatus which uses an argon fluoride excimer laser at 193 nanometers, the lines 10 may be 50 nanometers thick, and the space 12 between the lines may be 150 nanometers. It likely would not be possible using conventional techniques to form lines 50 nanometers thick with a spacing of 50 nanometers.

Although only two lines 10 are shown on the substrate 2, it will be appreciated that FIG. 2 shows only a portion of the substrate, and many more lines may be provided on the substrate.

Figure 2C:
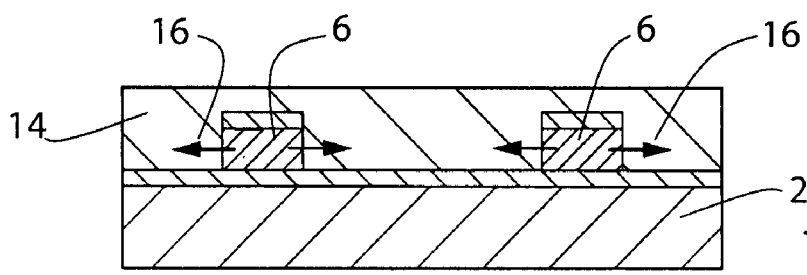

A coating layer 14 is spun onto the substrate 2, as shown in FIG. 2c. The coating layer 14 may be, for example, a RELACS (Resolution Enhancement Lithography Assisted by Chemical Shrink) polymer layer. The substrate is then heated, causing a chemical reaction to occur between the photoresist 6 and the coating layer 14. This is indicated schematically by arrows 16. The chemical reaction which occurs may be, for example, acid present in the photoresist 6 reacting with the coating layer 14 and causing cross-linking to occur in the coating layer. Examples of such reactions are known from the RELACS process, and from the so called Shrink Assist Film for Enhancement Resolution (SAFIER) process. These processes are well known in the literature, and for example are described and compared in "Realization of sub-80 nm Small Space Patterning in ArF Photolithography" by Si-Hyun Kim et al., Advances in Resist Technology and Processing XXI, Proceedings of the SPIE, Volume 5376, pp. 1082-1090 (2004).

Figure 2D:
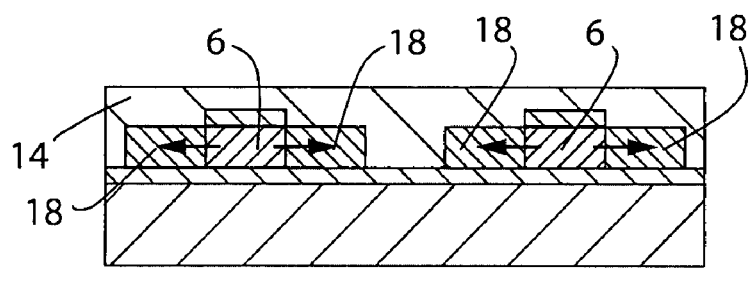

Referring to FIG. 2d, the heating is applied for a certain period of time, such that the chemical reaction between the photoresist 6 and the coating layer 14 extends laterally into the coating layer 14 by a certain distance. This results in a region of modified coating layer 18 which runs along either side of the lines 10. The top coating 8 helps to prevent the chemical reaction occurring above the photoresist 6.

Figure 2E:
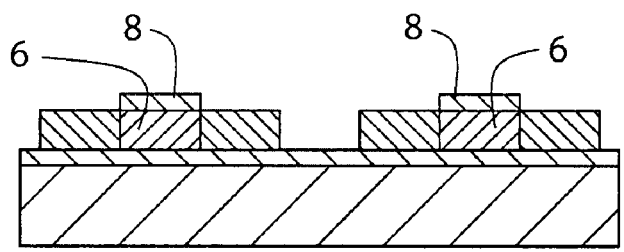

Referring to FIG. 2e, the portion of the coating layer 14 which has not reacted with the photoresist 6 is removed. This may be done, for example, by dissolving the unmodified coating layer 14. This may be achieved for example by rinsing using de-ionized water, as mentioned in the paper by Kim et al.

Figure 2F:
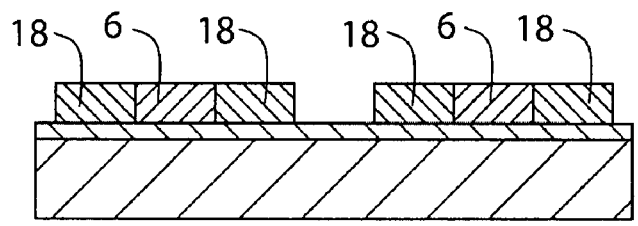

The top coating 8 is then removed, for example using chemical-mechanical polishing, thereby leaving the photoresist 6 and modified coating layer 18 in the configuration shown in FIG. 2f.

Figure 2G:
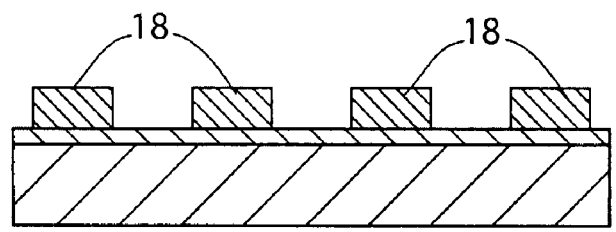

Referring to FIG. 2g, the photoresist 6 is removed, leaving behind the modified coating layer 18. This is possible because the chemical properties of the photoresist 6 and the modified coating layer 18 are different, thereby allowing selective removal of the photoresist 6. It can be seen from FIG. 2g that the remaining structure, which comprises lines of modified coating layer 18, comprises four substantially equally spaced lines. These lines have the same width as the lines 10 shown in FIG. 2b, but have half the separation. In other words, a structure has been created which includes the missing line 10a from FIG. 2b (although the structure has been displaced sideways when compared to FIG. 2b).

Figure 2H:
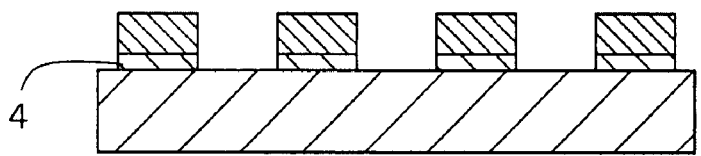
Figure 2I:
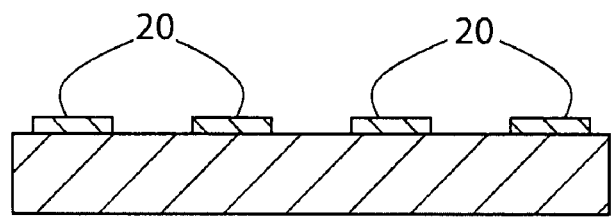

As shown in FIG. 2h, the hardmask 4 is etched, for example using an ion etch. This leaves exposed silicon in the locations which are not covered by the modified coating layer 18. Etching of the hardmask may 4 also remove at least some of the modified coating layer 18. Any residual remaining modified coating layer 18 is removed via chemical treatment (for example, a water based acid), to leave a hardmask pattern 20 as shown in FIG. 2i.

Figure 2J:
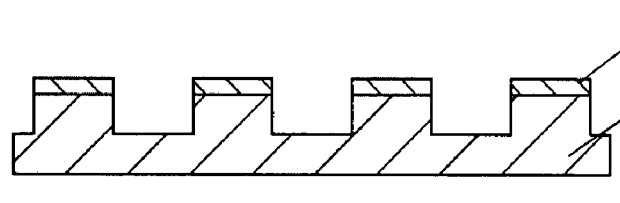

As shown in FIG. 2j, further etching (for example reactive ion etching (RIE)) is used to etch the pattern into the substrate 2. Once this has been done, the remaining hardmask 4 is removed, for example using etching. Where the hardmask 4 is amorphous carbon, then an oxidation process may be used to convert the amorphous carbon into $CO_2$, which can then be pumped away. This leaves behind the structure shown in FIG. 2k.

Figure 2K:
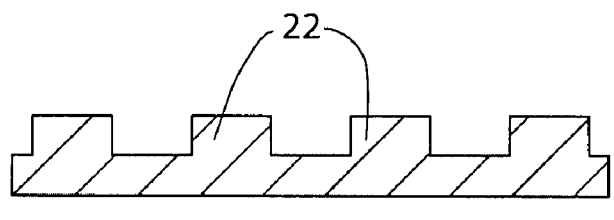

The structure shown in FIG. 2k comprises a series of lines 22 which have a width and a spacing which is smaller than that which likely would be achieved using conventional lithography and processing. The lines 22 have the same width as the lines 10 shown in FIG. 2b, but have half the separation. In other words, a structure has been created in the silicon which includes the missing line 10a from FIG. 2b (although the structure has been displaced sideways when compared to FIG. 2b). In the example of a lithographic apparatus using 193 nanometer radiation, the structure may, for example, comprise a series of lines with a width of 50 nanometers and a separation of 50 nanometers.

Compared with other known methods, the use of the top coating 8 has the benefit that it improves the fidelity of the features formed. The features will have flatter tops than would otherwise be the case. By avoiding (or reducing) rounding of the features in this way, control of the critical dimension of the features formed is improved.

A further embodiment of the invention is shown in FIG. 3. FIG. 3a shows in cross-section a portion of a substrate 50. The substrate 50 is covered with a hardmask layer 52, a poly-silicon layer 54 and a silicon-nitride layer 56, as shown in FIG. 3a. The hardmask layer 52 may be, for example, TiN, SiON or amorphous carbon (a-C). The hardmask layer may be resistant to oxidation, for reasons described below. The silicon-nitride layer 56 may be formed using low pressure chemical vapor deposition (LPCVD), and may have, for example, a thickness of 100-200 nm.

A series of trenches is formed in the poly-silicon layer 54 using a lithographic apparatus, which may for example be of the type shown schematically in FIG. 1. This is done via exposure of the silicon nitride 56 and poly-silicon 54, etching, and removal, thereby forming the structure shown in FIG. 3b.

Figure 3A:
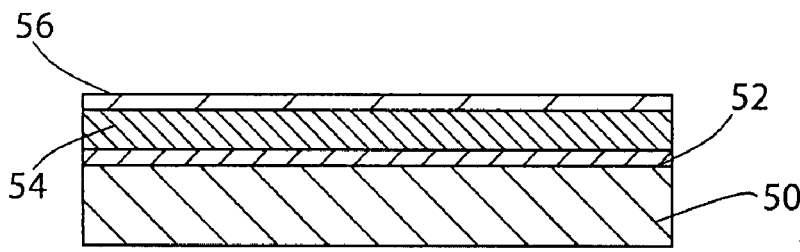
FIG. 3 shows schematically an alternative lithographic method according to an embodiment of the invention.
Figure 3B:
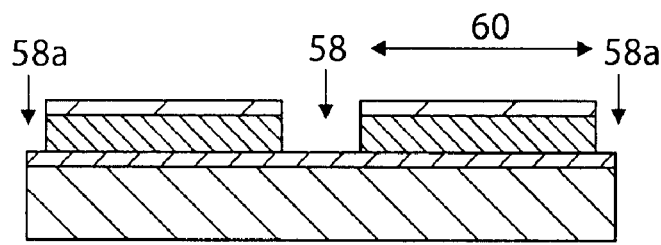

A trench 58 formed in the poly-silicon 54 is shown in FIG. 3b. The trench 58 is narrower than the distance 60 between this trench 58 and an adjacent trench 58a (shown only in part in this FIG. 3b). The distance 60 corresponds to three times the width of the trench 58. Where a lithographic apparatus is operating at or close to the limit of its resolution, the width of the narrowest trench that is achievable using that lithographic apparatus decreases if the separation between adjacent trenches is increased. Thus, in the present embodiment, the width of the trench 58 is narrower than that which would have been achievable if the separation 60 between the adjacent trenches was equal to the width of the trenches. For example, in a lithographic apparatus which uses an argon fluoride excimer laser at 193 nanometers, the trenches 58, 58a may be 50 nanometers thick, and the separation 60 between the trenches may be 150 nanometers. It likely would not be possible using that lithographic apparatus in a conventional manner to form trenches 50 nanometers thick with a separation of 50 nanometers.

Although only three trenches 58, 58a are shown, it will be appreciated that FIG. 2 shows only a portion of the substrate 50, and many more trenches may be provided on the substrate.

Figure 3C:
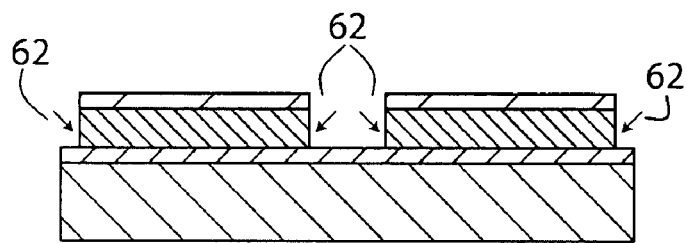

Referring to FIG. 3c, side-wall processing is used to modify the poly-silicon 54. The side-wall processing may be, for example, an oxidation process or an in-diffusion process. The side-wall processing is represented schematically by arrows 62. The modification may be, for example, oxidizing of the silicon of the poly-silicon material to form silicon-oxide. A selective poly-oxidation or SELOX process may be used to oxidize the poly-silicon.

The silicon-nitride layer 56 is resistant to oxidation, and helps prevents oxidation penetrating through the upper surface of the structure. This helps ensure that the oxidation penetrates only through side walls of the structure, and that a central region of poly-silicon remains unchanged.

It is not essential that silicon nitride 56 is used. In general, any suitable material which is resistant to oxidation may be used. For example, aluminum oxide may be used, or a metallic material may be used. The silicon-nitride itself may be conventional $Si_3N_4$, or may be, for example, so called rich silicon nitride $Si_xN_y$ with $(x/y)>(3/4)$.

Although oxidation has been described, other types of side-wall processing may be used. For example, the modification may be an in-diffusion process such as a silicidation. In silicidation, a metal layer is provided over the structure shown in FIG. 3c. The substrate is then heat treated, causing a chemical reaction to take place between the metal and the poly-silicon 54. This forms silicide in the areas in which the chemical reaction takes place.

Figure 3D:
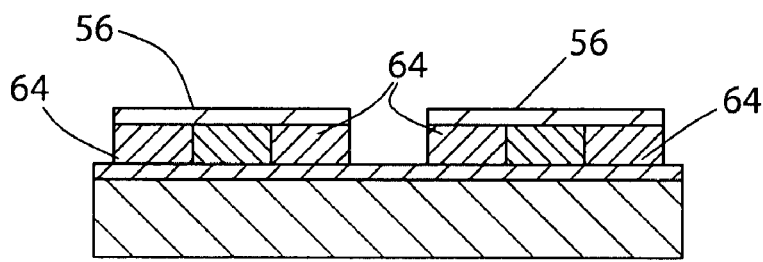

Referring to FIG. 3d, regions 64 of the poly-silicon which have been subjected to the side-wall processing are shown in a lighter shade of grey. The regions 64 extend a certain distance into the poly-silicon 54, and may, for example, comprise silicon-oxide or silicide. The distance through which the silicon-oxide (or silicide) penetrates is selected by applying the side-wall processing for an appropriate period of time. Characterization experiments may be used to determine the speed at which the silicon-oxide (or silicide) penetrates.

Figure 3E:
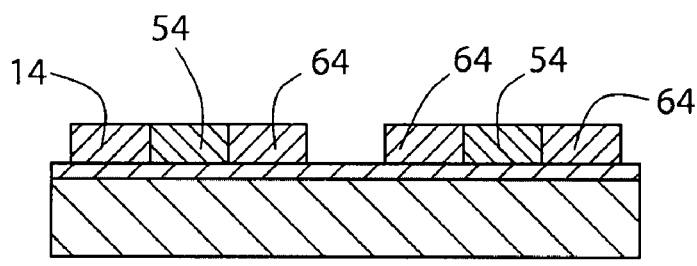

Referring to FIG. 3e, the silicon-nitride 56 is removed using selective etching. This may be, for example, a wet etch such as a stripping of the silicon-nitride in hot $H_3PO_4$ at 150-170° C. Alternatively or additionally, the silicon-nitride 56 may be removed by a reactive ion etch. Alternatively or additionally, the silicon-nitride 56 may be removed using chemical-mechanical polishing.

Removing the silicon-nitride 56 leaves behind lines of silicon-oxide 64 which run on either side of lines of poly-silicon 54.

The lines of poly-silicon 54 are removed using selective etching, for example reactive ion etching. Alternatively or additionally, a wet etch may be used. This technique is known from the etching of so called poly-plugs formed in silicon-oxide. The etching of the poly-silicon and of the silicon-nitride, may be performed using a single etch, for example a reactive ion etch.

Figure 3F:
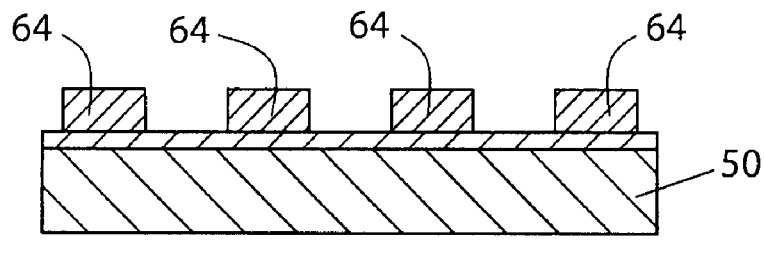

Once the lines of poly-silicon 54 have been removed, lines of silicon-oxide 64 are left behind, as shown in FIG. 3f. The structure shown in FIG. 3f comprises a series of lines 64 which have a width and a spacing which is smaller than that which likely would be achieved using conventional lithography and processing. The lines 64 have the same width as the lines 58, 58a shown in FIG. 3b, but have half the separation. In other words, a structure has been created which is likely not achievable using conventional lithographic techniques.

Figure 3G:
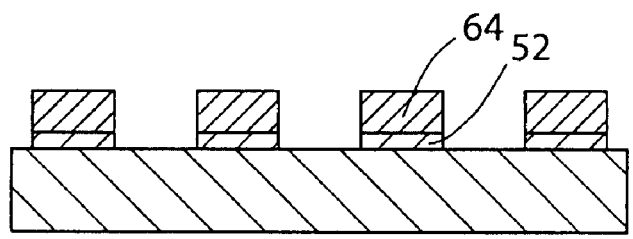

The pattern provided by the lines of silicon-oxide 64 is etched into the hardmask 52 using reactive ion etching. Etching of the hardmask may also consume some of the silicon-oxide. The resulting structure is shown in FIG. 3g.

Figure 3H:
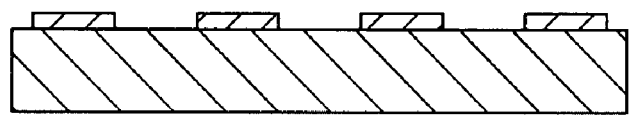
Figure 3I:
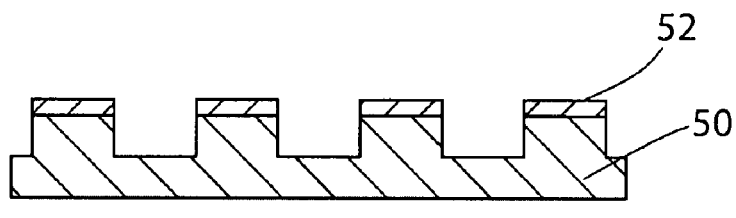
Figure 3J:
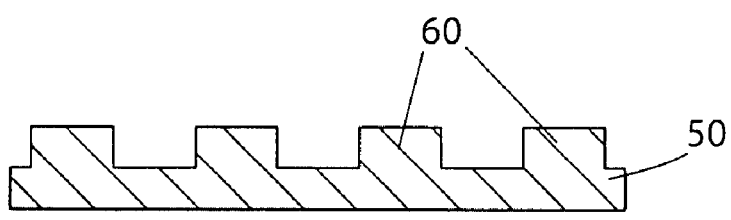

Referring to FIG. 3h, any remaining residual silicon-oxide 64 is removed, for example by using a wet etch. Following this, as shown in FIG. 3i, the pattern is etched into the substrate 50. This may be done, for example, by using a standard reactive ion etch.

The hardmask 52 is then removed. The structure which remains, shown in FIG. 3j, comprises a series of lines 66 which have a width and a spacing which is smaller than that which likely could be achieved using conventional lithography and processing. The lines 66 have the same width as the lines 58, 58a shown in FIG. 3b, but have half the separation. In the example of a lithographic apparatus using 193 nanometer radiation, the structure may, for example, comprise a series of lines with a width of 50 nanometers and a separation of 50 nanometers.

In some cases a buffer layer (not shown in FIG. 3a) may be provided between the poly-silicon layer 54 and the silicon nitride layer 56 in order to reduce the impact of any stresses which may arise between those layers. The buffer layer may be, for example, a wolfram nitride (WN) layer, tungsten nitride layer, or a layer of thermally grown silicon-oxide.

The materials used in the examples described above in relation to FIGS. 2 and 3 are given as examples only. Other materials may be used. In some cases it may not be necessary to provide a hardmask layer 4, 52.

Although the described embodiments refer to trenches and lines, an embodiment of the invention may be used to form other structures.

Although specific reference may be made in this text to the use of lithographic apparatus in the manufacture of ICs, it should be understood that the method described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. The description is not intended to limit the invention.

The invention claimed is:

1. A method of providing a pattern on a substrate, the method comprising:
   lithographically exposing a photoresist layer on the substrate and developing the photoresist to form a structure comprising the photoresist, the photoresist of the structure having a layer of top coating thereover, the top coating comprising a first material;
   covering the structure with a coating layer comprising a second material;
   inducing a chemical reaction between the photoresist of the structure and the second material of the coating layer, which reaction does not occur between the first material of the top coating layer, and the second material of the coating layer, to form regions of modified coating layer comprising the second material and a region of unmodified coating layer comprising the second material; and
   removing unmodified coating layer comprising the second material to leave behind a patterned structure formed form the regions of modified coating layer.

2. The method of claim 1, further comprising using the patterned structure as a template to etch a pattern into the substrate.

3. The method of claim 1, wherein a hardmask layer is provided between the substrate and the photoresist.

4. The method of claim 3, further comprising using the patterned structure as a template to etch a pattern into the substrate.

5. The method of claim 1, wherein the chemical reaction between the photoresist and the second material of the coating layer is induced by heating the substrate.

6. The method of claim 1, wherein the chemical reaction comprises acid present in the photoresist reacting with the second material of the coating layer and causing cross-linking to occur in the coating layer comprising the second material.

7. The method of claim 1, wherein the patterned structure comprises a series of lines.

8. The method of claim 1, wherein the photoresist is positive tone photoresist.

9. The method of claim 1, wherein the first material of the top coating is developable Top-Anti-Reflection Coating (TARC).

10. The method of claim 1, wherein the second material of the coating layer is a RELACS polymer.

11. A method of providing a pattern on a substrate, the method comprising:
    lithographically exposing a layer of poly-silicon on the substrate and a layer of silicon-nitride over the layer of poly-silicon;
    developing the exposed silicon-nitride and poly-silicon to form a structure;
    forming regions of modified poly-silicon in the structure using sidewall processing; and
    removing the silicon-nitride and unmodified poly-silicon to leave behind a patterned structure formed from the modified poly-silicon.

12. The method of claim 11, wherein the sidewall processing comprises an oxidation process.

13. The method of claim 12, wherein the oxidation process is a selective poly-oxidation process.

14. The method of claim 11, wherein the sidewall processing comprises an in-diffusion process.

15. The method of claim 11, further comprising using the patterned structure as a template to etch a pattern into the substrate.

16. The method of claim 11, wherein a hardmask layer is provided between the substrate and the poly-silicon.

17. The method of claim 16, further comprising using the patterned structure as a template to etch a pattern into the substrate.

18. The method of claim 11, wherein the patterned structure comprises a series of lines.

19. The method of claim 11, wherein the silicon nitride is rich silicon nitride.

20. The method of claim 11, wherein the modified poly-silicon is silicide.

21. The method of claim 11, wherein a buffer layer is provided between the poly-silicon layer and the silicon-nitride layer.

22. The method of claim 1, wherein the patterned structure is further formed from regions of unreacted photoresist and further comprising removing the unreacted photoresist from the patterned structure.

* * * * *

UNITED STATES PATENT AND TRADEMARK OFFICE
CERTIFICATE OF CORRECTION

PATENT NO.         : 8,017,310 B2
APPLICATION NO.    : 11/701517
DATED              : September 13, 2011
INVENTOR(S)        : Richard Johannes Franciscus Van Haren et al.

Page 1 of 1

It is certified that error appears in the above-identified patent and that said Letters Patent is hereby corrected as shown below:

On title page, item (75) Inventors
replace "Richard Franciscus Johannes Van Haren"
with --Richard Johannes Franciscus Van Haren--.

Signed and Sealed this
Eighth Day of November, 2011

David J. Kappos
*Director of the United States Patent and Trademark Office*